(12) United States Patent
Kondo

(10) Patent No.: US 7,285,374 B2
(45) Date of Patent: Oct. 23, 2007

(54) LIGHT-SENSITIVE LITHOGRAPHIC PRINTING PLATE PRECURSOR

(75) Inventor: Shunichi Kondo, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/059,348

(22) Filed: Feb. 17, 2005

(65) Prior Publication Data

US 2005/0181306 A1 Aug. 18, 2005

(30) Foreign Application Priority Data

Feb. 18, 2004 (JP) ............................ P.2004-041645

(51) Int. Cl.
G03F 7/09 (2006.01)
G03F 7/11 (2006.01)
G03F 7/16 (2006.01)

(52) U.S. Cl. ................................. 430/278.1; 430/271.1

(58) Field of Classification Search ............. 430/270.1, 430/271.1, 278.1
See application file for complete search history.

(56) References Cited

U.S. PATENT DOCUMENTS 6,566,035 B1 * 5/2003 Aoshima ................. 430/270.1

FOREIGN PATENT DOCUMENTS

| EP | 0 490 515 A1 | 11/1991 |
|---|---|---|
| EP | 0 485 958 A1 | 5/1992 |
| EP | 0 579 237 A2 | 1/1994 |
| EP | 1 031 881 A1 | 2/2000 |
| JP | 6-35174 A | 2/1994 |
| JP | 8-240914 A | 9/1996 |

OTHER PUBLICATIONS

Kajiwara Shigeru (1996) Patent Abstracts of Japan JP 08-080686 A.
European Search Report dated Jun. 2, 2005.

* cited by examiner

Primary Examiner—Richard L. Schilling
(74) Attorney, Agent, or Firm—Sughrue Mion Pllc.

(57) ABSTRACT

A light-sensitive lithographic printing plate precursor comprising an aluminum support having an anodized film on both surfaces thereof and a photo-polymerizable light-sensitive layer on one side of the support, wherein the anodized film on the surface of the support opposite to the light-sensitive layer side is provided on the entire surface and an amount of the anodized film is 0.5 g/m² or more.

4 Claims, No Drawings

LIGHT-SENSITIVE LITHOGRAPHIC PRINTING PLATE PRECURSOR

FIELD OF THE INVENTION

The present invention relates to a light-sensitive lithographic printing plate precursor having an aluminum support and particularly, to a photo-polymerizable lithographic printing plate precursor suitable for processing in an exposing machine (plate setter) and an automatic developing machine for CTP.

BACKGROUND OF THE INVENTION

Many studies have conventionally been conducted on light-sensitive lithographic printing plate precursors using a photo-polymerization system. Specifically, development of light-sensitive lithographic printing plate precursors having a high printing durability utilizing toughness of a layer of the photo-polymerization system and development of laser printing plate precursors utilizing a highly sensitive photo-polymerization-initiating system which is sensitive to an argon ion laser (488 nm), FD-YAG laser (532 nm) violet laser (405 nm) or the like have been made.

Many of the light-sensitive lithographic printing plate precursors comprise a support of grained and anodized aluminum plate having provided thereon a photo-polymerizable composition layer comprising an addition-poloymerizable ethylenic double bond-containing compound, a photo-polymerization initiator, an organic polymer binder and a thermal polymerization inhibitor and a barrier layer for oxygen that inhibits polymerization on the photo-polymerizable composition layer.

The light-sensitive lithographic printing plate precursor is imagewise exposed to a desired image to polymerize and cure the exposed area, followed by removing the unexposed area with an alkali aqueous solution (development), thereby obtaining a relief image. In the unexposed area, the aluminum support is revealed and, since the surface of the aluminum support is hydrophilic, it retains water and repels an oily ink, whereas the image area (area which have been cured by the imagewise exposure) is oleophilic and repels water and receives an ink, thereby exhibiting function as a printing plate.

The processes of exposure and development have conventionally been manually conducted using a contact exposing machine and an automatic developing machine. With the spread of CTP (Computer-To-Plate) system, however, pre-press steps including film working are omitted, and digital data processing permits a series of processes. Thus, it has become common to mechanically and continuously conduct the exposure process and the development process by loading unexposed printing plate precursors together on a drawing machine (plate setter). Therefore, cases increase wherein the printing plate precursor is scratched in the plate setter during conveyance of the printing plate precursor to an exposing section, mounting and removal of the printing plate precursor on and from the exposing section and conveyance to an automatic developing machine, which has become a serious problem. The formation of scratch on the light-sensitive layer side results in crack of the overcoat layer, thus causing serious problems that spoil the essential functions as a printing plate precursor, for example, polymerization failure or dark polymerization of the unexposed area due to pressure effects. Accordingly, countermeasures have been taken from the apparatus side, for example, development of a conveying method which enables the surface of the light-sensitive material to avoid contact with the apparatus, precise polishing of rollers and the like. On the other hand, regarding the printing plate precursor, measures for increasing adhesion force between the overcoat layer and the light-sensitive layer and measures for adjusting film properties and slipping properties of the overcoat layer have been investigated. Consequently, a practically satisfactory level can be achieved. On the contrary, scratch on the aluminum surface (back surface) opposite to the light-sensitive layer side has been comparatively no concern because the scratch exerts no detrimental influence on printing so long as it is not so serious in case of a small number of prints. Recently, however, with popularization of CTP and increase in number of prints, the scratch on the back surface causes problems. When aluminum waste moves to the light sensitive layer surface side, problems arise that the aluminum waste causes scratch on the surface or that since the aluminum waste acts as a light shielding agent, the area which should essentially be exposed is not exposed. Therefore, development of a printing plate precursor that scarcely suffers formation of scratch on the aluminum back surface has been demanded.

No known documents have been found on the countermeasures against the formation of scratch on aluminum back surface but, though for different purposes, several techniques for improving the aluminum back surface have been reported. For instance, as a countermeasure to prevent formation of scum in an alkali developing solution by preventing dissolution of aluminum, which causes the scum, from the aluminum support into the alkali developing solution, there have been disclosed a method of providing a coating layer comprising an organic polymer compound on the aluminum back surface opposite to the light-sensitive layer side (see, e.g., Patent Document 1), a method of providing a metal compound obtained by hydrolysis and polycondensation of an organic metal compound or an inorganic metal compound on the back surface of a light-sensitive lithographic printing plate precursor (see, e.g., Patent Document 2), and a method of providing a layer comprising a sol-gel reaction solution obtained by hydrolysis and polycondensation of an organic metal compound or inorganic metal compound, a polymer compound and a plasticizer on the back surface of an aluminum substrate, which has been anodized on both surfaces thereof, opposite to the photo-polymerizable layer side (see, e.g., Patent Document 3). However, these methods are insufficient as countermeasures against formation of scratch, and more improvement has been desired. The presence of an anodized film on the back surface of the aluminum plate has been known (see, e.g., Patent Document 3). However, the anodized film is formed by going round of electric field to the back side at the formation of the anodized film on the light-sensitive layer side. Accordingly, the thickness of the anodized film on both edges of an aluminum coil is larger and the thickness thereof in the central portion is smaller so that the anodized film is uneven in thickness and insufficient as countermeasures against the formation of scratch utilizing hardness of the anodized film.

Also, a method of providing an organic polymer having a high Tg on the back surface for the purpose of preventing adhesion to the light-sensitive layer surface has been disclosed (see, e.g., Patent Document 4). However, this method is also insufficient as countermeasures against the formation of scratch. Therefore, improvements thereof have been desired.

Patent Document 1: EP-A-0490515
Patent Document 2: JP-A-6-35174

Patent Document 3: JP-A-8-240914
Patent Document 4: EP-A-1031881

SUMMARY OF THE INVENTION

An object of the invention is to provide a light-sensitive lithographic printing plate precursor which does not suffer formation of scratch on the back surface of the aluminum support thereof during its handling in a CTP system (including an exposing machine and an automatic developing machine) and which is prevented from various troubles caused by the aluminum scratch.

As a result of intensive investigations for attaining the object, the inventor has found that formation of the scratch can be effectively depressed by providing uniformly an anodized film of a thickness of more than a certain level on the back surface of the aluminum plate to complete the invention.

The invention includes a light-sensitive lithographic printing plate precursor comprising an aluminum support having an anodized film on both surfaces thereof and a photo-polymerizable light-sensitive layer on one side of the support, wherein the anodized film on the surface of the support opposite to the light-sensitive layer side is provided the entire surface and an amount of the anodized film is 0.5 g/m$^2$ or more.

DETAILED DESCRIPTION OF THE INVENTION

According to the invention, a light-sensitive lithographic printing plate precursor, which does not suffer formation of scratch on the back surface of aluminum support, removes various troubles due to the aluminum scratch and shows good handling properties in a CTP system (including an exposing machine and an automatic developing machine), is provided.

The light-sensitive lithographic printing plate precursor of the invention is described in detail below.

[1] Support

The support used for the light-sensitive lithographic printing plate precursor of the invention includes a plate composed of aluminum or aluminum alloy. Further, a composite sheet obtained by laminating a plate of aluminum or aluminum alloy on both sides of paper or a plastic film can also be used. A preferred aluminum plate includes a pure aluminum plate and an aluminum alloy plate containing aluminum as a major component and a trace amount of foreign elements and, a plastic film having aluminum laminated or deposited thereon may also be used. The foreign elements contained in aluminum include silicon, iron, manganese, copper, magnesium, chromium, zinc, bismuth, nickel and titanium. The total amount of the foreign elements is preferably not more than 10% by weight. While preferred aluminum for use in the invention is pure aluminum, entirely pure aluminum is difficult to produce from the standpoint of refining technique and, accordingly, existence of a trace amount of foreign elements is acceptable. Thus, the aluminum plate used in the invention is not specified as to its composition, and conventionally known materials, for example, JIS A 1050, JIS A 1100, JIS A 3003, JIS A 3103 and JIS A 3005 can be appropriately utilized. The thickness of the aluminum plate used in the invention is usually from about 0.1 mm to about 0.6 mm.

Before roughening the aluminum plate, a degreasing treatment of the plate may be performed, for example, with a surfactant, an organic solvent or an alkaline aqueous solution to remove rolling oil from the plate surface, if desired. The surface of the aluminum plate is first subjected to a roughening treatment. Methods for the treatment include a mechanically roughening method, a roughening method of electrochemically dissolving the surface, and a method of selectively chemically dissolving the surface. The mechanical method used includes known methods, for example, a ball abrasion method, a brush abrasion method, a blast abrasion method, and a buff abrasion method. The electrochemically roughening method may be performed by passing an alternating or direct current in an electrolyte solution containing hydrochloric acid or nitric acid. Alternatively, the mechanically roughening method and the electrochemically roughening method may be utilized in combination as disclosed in JP-A-54-63902.

The thus-roughened aluminum plate, after being subjected to an alkali etching treatment and a neutralizing treatment, if desired, is subjected to an anodization treatment in order to raise the water retention and abrasion resistance on the surface of the photo-polymerizable light-sensitive layer side. As the electrolyte used for the anodization treatment of the aluminum plate, any electrolyte may be used that can form a porous oxide film. Ordinarily, sulfuric acid, phosphoric acid, oxalic acid, chromic acid and a mixture thereof can be used. The concentration of the electrolyte solution is appropriately determined depending upon the species of the electrolyte.

The anodization treatment conditions are not specified in a general manner because they vary depending upon the kind of the electrolyte to be used but, as an ordinary guide, the concentration of the electrolyte solution is suitably from 1 to 80% by weight, the temperature of the solution is suitably from 5 to 70° C., the electric current is preferably from 5 to 60 A/dm$^2$, the voltage is suitably from 1 to 100 V, and the electrolysis time is suitably from 10 seconds to 5 minutes. Among them, an anodizing method of using sulfuric acid as an electrolyte and conducting anodization at a high current density as described in British Patent 1,412,768 and a method of conducting anodization in a sulfuric acid aqueous solution having a low concentration as described in U.S. Pat. No. 4,211,619 are preferred, and a method of anodizing in an electrolytic solution of 5 to 20% by weight in concentration of sulfuric acid, 3 to 15% by weight in concentration of dissolved aluminum ion, and 25 to 50° C. in temperature thereof by applying a direct current of 5 to 20 A/dm$^2$ in current density is most preferred.

The amount of the anodized film on the photo-polymerizable light-sensitive layer side is preferably 1.0 g/m$^2$ or more, more preferably from 2.0 to 6.0 g/m$^2$, in order to ensure printing durability and prevent formation of scratch in non-image areas of a lithographic printing plate precursor and adhesion of an ink onto the scratch portion at printing. Adjustment of the anodized film thickness to 1.0 g/m$^2$ or more serves to depress the occurrence of so-called "scratch stain".

The anodization treatment of the aluminum plate on the light-sensitive layer side thereof is conducted on the surface of the support to be used for printing. However, the anodized film is also ordinarily formed on the back surface of the aluminum plate in an amount of 0.01 to 3 g/m$^2$ in such distribution that the thickness of the anodized film is thicker at the edge portion of the aluminum plate and thinner at the central portion of the aluminum plate due to going round of electric line of force to the back surface of the aluminum plate.

The anodized film formed by electric line of force going round to the back surface cannot fully prevent scratch formed during conveyance of the plate in a plate setter or an automatic developing machine, since the amount of anodized film largely varies depending upon the position of the plate.

On the contrary, the characteristic aspect of the invention is to form the anodized film uniformly all over the back surface in an amount of 0.5 g/m$^2$ or more same as the anodized film formed on the light-sensitive layer side, in contrast with the anodized film formed by the going round of electric line of force to the back surface of the plate.

In order to form the anodized film on the back surface of aluminum support, for example, a method of disposing a cathode also on the back surface of aluminum support is employed.

The amount of the anodized film formed all over the back surface is 0.5 g/m$^2$ or more in view of preventing formation of scratch. There is no limit as to the upper limit of the thickness of the anodized film on the back surface but, since it requires electric power to form the anodized film, the amount of the anodized film is practically preferably from 0.7 g to 6 g/m$^2$, more preferably from 1.0 g to 3 g/m$^2$.

The amount of the anodized film can be determined by measuring a peak of Al$_2$O$_3$ using fluorescent X ray and converting the peak height to the amount of anodized film using a calibration curve between the peak height and the amount of anodized film.

In the invention, the existence of the anodized film on the entire back surface of an aluminum support of the light-sensitive lithographic printing plate precursor in an amount of 0.5 g/m$^2$ or more can be determined. This determination can be made by measuring (a) the amount of anodized film in the central portion of the anodized film that is formed on the side of the aluminum support positioned opposite to the light-sensitive layer side, and (b) the amounts of anodized film at the portions located approximately 5 cm away from the respective closest edges of the aluminum support. More specifically, the locations in (b) form a line in the transverse direction passing through the central portion and crossing the aluminum support at right angles with respect to the treatment direction (machine direction). The measurements of (a) and (b) must all be 0.5 g/m$^2$ or more.

Also, on the anodized film formed on the back surface may be provided, if desired, a back coat layer of an organic polymer or an inorganic compound for the purpose of preventing dissolution of aluminum in a developing solution. A particularly preferred back coat layer includes the back coat layer described in JP-A-8-240914.

After the anodization treatment, the surface of the aluminum plate on the light-sensitive layer side may be subjected to a hydrophilization treatment, if desired. Examples of the hydrophilization treatment that may be used in the invention include a method using an alkali metal silicate (e.g., an aqueous sodium silicate solution) as disclosed in U.S. Pat. Nos. 2,714,066, 3,181,461, 3,280,734 and 3,902,734. In the method, a support is treated by immerison or electrolysis in an aqueous sodium silicate solution.

Other usable methods include a method wherein the surface is treated with potassium fluorozirconate disclosed in JP-B-36-22063 and a method wherein the surface is treated with polyvinylphosphonic acid as disclosed in U.S. Pat. Nos. 3,276,868, 4,153,461 and 4,689,272.

The light-sensitive lithographic printing plate precursor of the invention is prepared by forming a photo-polymerizable light-sensitive layer described hereinafter on the surface-treated aluminum support. Prior to the coating of the light-sensitive layer, an organic or inorganic undercoat layer may be provided on the support, if desired.

[2] Undercoat Layer

An organic undercoat layer may be provided, if desired, on the aluminum plate before coating thereon the light-sensitive layer. The organic compounds used in the organic undercoat layer are selected from carboxymethyl cellulose; dextrin; gum arabic; phosphonic acids having an amino group, for example, 2-aminoethylphosphonic acid; organic phosphonic acids, for example, phenylphosphonic acid optionally having a substituent, naphtylphosphonic acid optionally having a substituent, alkylphosphonic acid optionally having a substituent, glycerophosphonic acid optionally having a substituent, methylenediphosphonic acid optionally having a substituent, and ethylenediphosphonic acid optionally having a substituent; organic phosphoric acid esters, for example, phenylphosphoric acid optionally having a substituent, naphthylphosphoric acid optionally having a substituent, alkylphosphoric acid optionally having a substituent, and glycerophosphoric acid optionally having a substituent; organic phosphinic acids, for example, phenylphosphinic acid optionally having a substituent, naphthylphosphinic acid optionally having a substituent, alkylphosphinic acid optionally having a substituent, and glycerophosphinic acid optionally having a substituent; amino acids, for example, glycine and β-alanine; and hydrochlorides of amines having a hydroxy group, for example, triethanolamine hydrochloride. The compounds may be used in combination of two or more thereof.

After the above-described surface treatment, an undercoat layer comprising a water-soluble resin, for example, polyvinylphosphonic acid, a polymer or copolymer having sulfonic acid groups in the side chains thereof (JP-A-59-101651), polyacrylic acid, a water-soluble metal salt (e.g., zinc borate), a yellow dye or an amine salt may be provided. Further, a sol-gel treated support to which a functional group capable of causing addition reaction by a radical as disclosed in JP-A-7-159983 may also be preferably used.

Other preferred examples include an undercoat layer having an onium group described in JP-A-2003-021908 and a water-resisting hydrophilic layer provided as an undercoat layer on a support. Examples of such an undercoat layer include a layer comprising an inorganic pigment and a binder as described in U.S. Pat. No. 3,055,295 and JP-A-56-13168, a hydrophilic swelling layer as described in JP-A-9-80744, and a sol-gel film comprising titanium oxide, polyvinyl alcohol and a silicic acid as described in JP-T-8-507727 (the term "JP-T" as used herein means a published Japanese translation of a PCT patent application). The hydrophilization treatment is performed not only to render the surface of the support hydrophilic but also to prevent detrimental reaction due to the light-sensitive composition provided on the support and to increase adhesion of the light-sensitive layer to the support.

The dry amount of the undercoat layer is ordinarily 0.5 to 500 mg/m$^2$, preferably 1 to 100 mg/m$^2$.

[3] Photopolymerizable Light-sensitive Layer

Thee photo-polymerizable light-sensitive composition (hereinafter also referred to as "photo-polymerizable composition") constituting the photo-polymerizable light-sensitive layer (hereinafter also simply referred to as "light-sensitive layer") of the light-sensitive lithographic printing plate precursor of the invention is not particularly limited, but is preferably a composition containing an addition-polymerizable, ethylenically unsaturated bond-containing compound, a polymer binder and a photo-polymerization initiator as necessary components and, if desired, various compounds, for example, a sensitizing dye, a co-sensitizer, a colorant, a plasticizer and a thermal polymerization inhibitor.

[Ethylenically Unsaturated Bond-containing Compound]

The ethylenically unsaturated bond-containing compound (hereinafter also referred to as "ethylenically unsaturated compound") is a compound having an ethylenically unsaturated bond and capable of conducting addition polymerization by the action of a photo-polymerization initiator to be crosslinked and cured when a photo-polymerizable composition containing the compound is irradiated with an active light. The addition-polymerizable ethylenically unsaturated bond-containing compound can be appropriately selected from compounds having at least one, preferably two or more, terminal ethylenically unsaturated bonds. They are in the chemical form of, for example, a monomer, a prepolymer (i.e., dimer, trimer or oligomer), and a mixture thereof or a copolymer thereof.

Examples of the monomer include an ester between an unsaturated carboxylic acid (e.g., acrylic acid, methacrylic acid, itaconic acid, crotonic acid, isocrotonic acid or maleic acid) and an aliphatic polyhydric alcohol compound, and an amide between an unsaturated carboxylic acid and an aliphatic polyamine compound. Specific examples of the monomer of the ester between aliphatic polyhydric alcohol compound and unsaturated carboxylic acid include acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer; methacrylates, for example, tetramethylene glycol dimethacrylate, triethylene glycol dimethacrylate, neopentyl glycol dimethacrylate, trimethylolpropane trimethacrylate, trimethylolethane trimethacryloate, ethylene glycol dimethacrylate, 1,3-butanediol dimethacrylate, hexanediol dimethacrylate, pentaerythritol dimethacrylate, pentaerythritol trimethacryloate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane and bis-[p-(methacryloxyethoxy)phenyl]dimethylmethane; itaconates, for example, ethylene glycol diitaconate, propylene glycol diitaconate, 1,5-butanediol diitaconate, 1,4-butanediol diitaconate, tetramethylene glycol diitaconate, pentaerythritol diitaconate and sorbitol tetraitaconate; crotonates, for example, ethylene glycol dicrotonate, tetramethylene glycol dicrotonate, pentaerythritol dicrotonate and sorbitol tetracrotonate; isocrotonates, for example, ethylene glycol diisocrotonate, pentaerythritol diisocrotonate and sorbitol tetraisocrotonate; and maleates, for example, ethylene glycol dimaleate, triethylene glycol dimaleate, pentaerythritol dimaleate and sorbitol tetramaleate. Further, there may be illustrated mixtures of the above-described ester monomers. Specific examples of the monomer of amide between aliphatic polyamine compound and unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other examples include vinylurethane compounds having 2 or more polymerizable vinyl groups per molecule, which are obtained by adding a vinyl monomer having a hydroxy group represented by the following formula (A) to a polyisocyanate compound having 2 or more isonanato groups per molecule as described in JP-B-48-41708.

$$CH_2=C(R)COOCH_2CH(R')OH \qquad (A)$$

In formula (A), R and R' each represents H or $CH_3$.

Also, there may be illustrated polyfunctional acrylates and methacrylates, for example, urethane acrylates as described in JP-A-51-37193 and JP-B-2-32293, polyester acrylates as described in JP-A-48-64183, JP-B-49-43191 and JP-B-52-30490, and epoxyacrylates obtained by reacting an epoxy resin with (meth)acrylic acid. Further, photocurable monomers and oligomers described in Nippon Secchaku Kyokaishi, Vol. 20, No. 7, pages 300 to 308 (1984) may be used. The amount of the ethylenically unsaturated bond-containing compound used is ordinarily in the range of from 5 to 80% by weight, preferably from 30 to 70% by weight, based on the total weight of the light-sensitive layer.

[Polymer Binder]

As the polymer binder used in the light-sensitive layer, an organic polymer soluble or swellable in an aqueous alkali solution is used, because it is required not only to function as a film-forming agent of the light-sensitive composition but also to dissolve in an alkali developing solution. For example, when a water-soluble organic polymer is used as the organic polymer, the light-sensitive layer can be developed with water. Examples of such organic polymer include addition polymers having carboxylic acid group in the side chain as described in JP-A-59-44615, JP-B-54-34327, JP-B-58-12577, JP-B-54-25957, JP-A-54-92723, JP-A-59-53836 and JP-A-59-71048, specifically, methacrylic acid copolymers, acrylic acid copolymers, itaconic acid copolymers, crotonic acid copolymers, maleic acid copolymers, and partially esterified maleic acid copolymers.

There are also illustrated acidic cellulose derivatives having carboxylic acid group in the side chain. In addition, compounds obtained by adding a cyclic acid anhydride to an addition polymer having hydroxy group are useful. Among them, [benzyl (meth)acrylate/(meth)acrylic acid/if desired, other addition-polymerizable vinyl monomer] copolymer and [allyl (meth)acrylate/(meth)acrylic acid/if desired, other addition-polymerizable vinyl monomer] copolymer are preferred. Further, polyvinylpyrrolidone and polyethylene oxide are useful as the water-soluble organic polymer. Also, in order to increase strength of the cured film, an alcohol-soluble polyamide and polyether between 2,2-bis(4-hydroxyphenyl)propane and epichlorohydrin are useful. Further, polyurethane resins described in JP-B-7-120040, JP-B-7-120041, JP-B-7-120042, JP-B-8-12424, JP-A-63-287944, JP-A-63-287947, JP-A-1-271741 and JP-A-11-352691 are also useful for use in the invention.

The strength of cured film can be improved by introducing a radical-reactive group into the side chain of the organic polymer. Examples of an addition-polymerizable functional group include an ethylenically unsaturated bond group, an amino group and an epoxy group, examples of a functional group capable of forming a radical upon irradiation with light include a mercapto group, a thiol group, a halogen atom, a triazine structure and an onium salt structure, and examples of a polar group include a carboxy group and an imido group. As the addition-polymerizable functional group, the ethylenically unsaturated bond group, for example, an acryl group, a methacryl group, an allyl group and a styryl group are particularly preferred. A functional group selected from an amino group, a hydroxy group, a phosphonic acid group, a phosphoric acid group, a carbamoyl group, an isocyanato group, a ureido group, a ureylene group, a sulfonic acid group and an ammonio group are also useful.

In order to maintain developability of the light-sensitive composition, the polymer binder used in the invention preferably has an appropriate molecular weight and acid value. Specifically, a polymer having a weight average molecular weight of 5,000 to 300,000 and an acid value of 20 to 200 is effectively used in the invention. The polymer binder can be incorporated into the light-sensitive composition in an appropriate amount. However, in view of image strength, the amount is preferably 90% by weight or less, more preferably from 10 to 90% by weight, still more preferably from 3 to 80% by weight, based on the total weight of the light-sensitive layer.

Also, a ratio of the photo-polymerizable ethylenically unsaturated bond-containing compound to the polymer binder is in a range of preferably from 1/9 to 9/1, more preferably from 2/8 to 8/2, still more preferably from 3/7 to 7/3, by weight.

[Photo-polymerization Initiator]

As the photo-polymerization initiator incorporated into the light-sensitive layer of the light-sensitive lithographic printing plate precursor of the invention, various photo-polymerization initiators known in patents and literatures, or a combination system of two or more photo-polymerization initiators (photo-initiation system) may be appropriately selected to use depending upon a wavelength of a light source used. Specific examples thereof are illustrated below, but the invention is not limited thereto. Various photo-initiation systems have also been proposed for using visible light of 400 nm or more, Ar laser, second harmonic of semiconductor laser or SHG-YAG laser as the light source. For example, there are illustrated a certain kind of photo-reductive dyes (e.g., Rose Bengale, Eosine and Erythrosine) described in U.S. Pat. No. 2,850,445 and a system comprising a combination of a dye and an initiator, for example, a composite initiator system of a dye and an airline (JP-B-44-20189), a combined use of hexaarylbiimidazole and a radical generator (JP-B-45-37377), a system of hexaarylbiimidazole and p-dialkylaminobenzylidene ketone (JP-B-47-2528 and JP-A-54-155292), a system of a cyclic cis-α-dicarbonyl compound and a dye (JP-A-48-84183), a system of a cyclic triazine and a merocyanine dye (JP-A-54-151024), a system of 3-ketocoumarin and an active agent (JP-A-52-112681 and JP-A-58-15503), a system of biimidazole, a styrene derivative and thiol (JP-A-59-140203), a system of an organic peroxide and a dye (JP-A-59-1504, JP-A-59-140203, JP-A-59-189340, JP-A-62-174203, JP-B-62-1641 and U.S. Pat. No. 4,766,055), a system of a dye and an active halogen compound (JP-A-63-258903 and JP-A-2-63054), a system of a dye and a borate compound (JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348 and JP-A-1-138204), a system of a rhodanine ring-containing dye and a radical generator (JP-A-2-179643 and JP-A-2-244050), a system of titanocene and a 3-ketocoumarin dye (JP-A-63-221110), a system wherein titanocene is combined with a xanthene dye and, further, an amino group- or urethane group-containing addition-polymerizable ethylenically unsaturated bond-containing compound (JP-A-4-221958 and JP-A-4-21975-6), a system of titanocene and a specific merocyanine dye (JP-A-6-295061) and a system of titanocene and a benzopyran ring-containing dye (JP-A-8-334897).

Recently, a laser emitting light having a wavelength of 400 to 410 nm (violet laser) has been developed, and a photo-initiation system showing a high sensitivity to light having a wavelength of 450 nm or less has been developed. Such photo-initiation system can also be employed. Examples thereof include a cation dye/borate system (JP-A-11-84647), a merocyanine dye/titanocene system (JP-A-2000-147763), and a carbazole type dye/titanocene system (JP-A-2001-42524). In the invention, a system using a titanocene compound is particularly preferred because of excellent sensitivity.

As the titanocene compound, various compounds may be used. For example, the compound may be appropriately selected to use from various titanocene compounds described in JP-A-59-152396 and JP-A-61-151197. Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl bis-2,6-difluorophen-1-yl, dicyclopentadienyl-Ti-bis-2,4-difluorophen-1-yl, dimethylcyclopentadienyl-Ti-bis-2,3,4,5,6-tetrafluorophen-1-yl, dimethylcyclopentadienyl-Ti-bis-2,6-difluorophen-1-yl and dicyclopentadienyl-Ti-bis-2,6'-difluoro-3-(pyr-1-yl)phen-1-yl.

Further, it is known to more enhance photo-initiation ability by adding to the above-described photo-polymerization initiator a hydrogen-providing compound, for example, a thiol compound (e.g., 2-mercaptobenzothiazole, 2-mercaptobenzimidazole or 2-mercaptobenzoxazole) or an amine compound (e.g., N-phenyglycine or N,N-dialkylamino aromatic alkyl ester), if desired. The amount of the photo-polymerization initiator (system) is in the range of from 0.05 to 100 parts by weight, preferably from 0.1 to 70 parts by weight, still more preferably from 0.2 to 50 parts by weight, based on 100 parts by weight of the ethylenically unsaturated bond-containing compound.

[Co-Sensitizer]

The sensitivity of the light-sensitive layer can be more improved by using a certain kind of additive (hereinafter referred to as "co-sensitizer"). The mechanism thereof has not been clarified, but is believed to be mainly based on the following chemical processes.

Specifically, it is believed that various intermediate active species (radicals, peroxides, oxides, reductants, etc.) generated during the photo reaction initiated by light absorption of the photo-initiation system and the subsequent addition polymerization reaction react with the co-sensitizer to generate new active radicals.

The co-sensitizers are roughly classified into the following groups (a) to (c). However, at a commonly accepted theory level, it is unclear to which group individual compounds belong in many cases.

(a) Compounds capable of generating active radical upon being reduced (b) Compounds capable of generating active radical upon being oxidized (c) Compounds capable of reacting with a less active radical to form a more active radical or capable of functioning as a chain transfer agent (a) Compounds Capable of Generating Active Radical Upon Being Reduced Compounds having a carbon-to-halogen bond: It is believed that the carbon-to-halogen bond is reductively sprit to generate an active radical. Specific examples thereof preferably used include trihalomethyl-s-triazines and trihalomethyloxadiazoles.

Compounds having a nitrogen-to-nitrogen bond: It is believed that the nitrogen-to-nitrogen bond is reductively split to generate an active radical. Specifically, hexaarylbiimidazoles are preferably used.

Compounds having an oxygen-to-oxygen bond: It is believed that the oxygen-to-oxygen bond is reductively split to generate an active radical. Specific examples thereof preferably used include organic peroxides.

Onium compounds: It is believed that carbon-to-hetero atom bond or oxygen-to-nitrogen bond is reductively split to generate an active radical. Specific examples thereof preferably used include diaryliodonium salts, triarylsulfonium salts and N-alkoxypyridinium(azinium) salts.

Ferocene, iron-arene complexes: These compounds can reductively generate an active radical.

(b) Compounds Capable of Generating an Active Radical Upon Being Oxidized

Alkylaryl complexes: It is believed that carbon-to-hetero atom bond is oxidatively split to generate an active radical. Specific examples thereof preferably used include triarylalkyl borates.

Alkylamine compounds: It is believed that C—X bond on the carbon atom adjacent to nitrogen atom is oxidatively split to generate an active radical. As X, a hydrogen atom, a carboxy group, a trimethylsilyl group or a benzyl group is preferred. Specific examples thereof include ethanolamines, N-phenylglycines and N-trimethylsilylmethylanilines.

Sulfur-containing or tin-containing compounds: Compounds wherein the nitrogen atom in the above-described amines is replaced by a sulfur atom or a tin atom can generate an active radical based on the same mechanism. Also, compounds having an S—S bond are known to exhibit sensitization action based on S—S bond splitting.

α-Substituted methyl carbonyl compounds: These compounds can generate an active radical by oxidative splitting of carbonyl-to-α-carbon bond. Also, compounds obtained by converting carbonyl of the carbonyl compound to oxime ether exhibit the same action. Specific examples thereof include a 2-alkyl-1-[4-(alkylthio)phenyl]-2-morpholino-pronone-1 and an oxime ether obtained by reacting the compound with a hydroxylamine, then etherifying N—OH.

Sulfinates: These compounds can reductively generate an active radical. Specific examples thereof include sodium arylsulfinates.

(c) Compounds Capable of Reacting with a Less Active Radical to Form a More Active Radical or Capable of Functioning as a Chain Transfer Agent For example, compounds having SH, PH, SiH or GeH are used. These compounds provide hydrogen to a less active radical species to generate a more active radical or, after being oxidized, undergo deprotonation to generate a radical. Specific examples thereof include 2-mercaptobenzimidazoles.

Many of more specific examples of the co-sensitizer are described, for example, in JP-A-9-236913 as additives for improving sensitivity. A part of them are illustrated below, but the invention is not limited thereto.

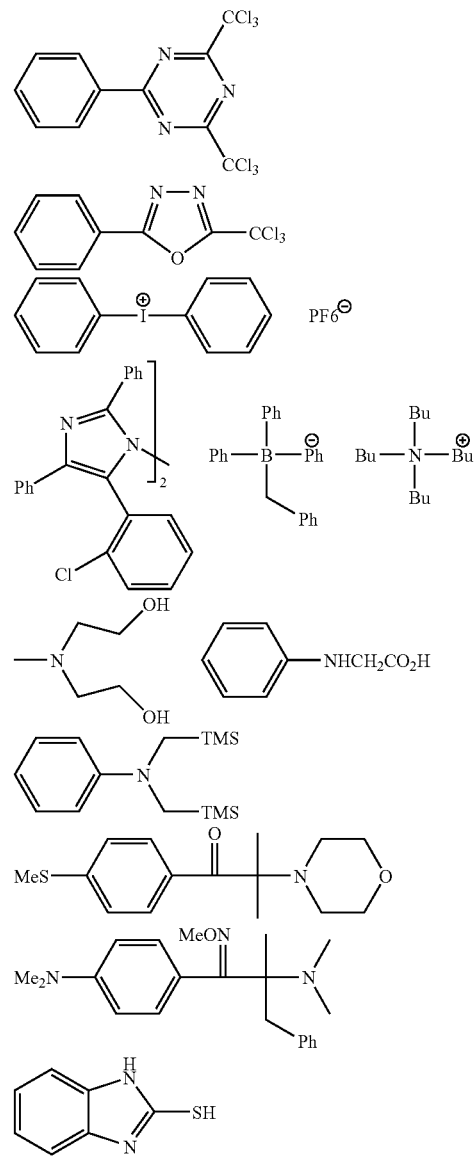

Various chemical modifications may be made to the co-sensitizer for improving characteristics of the light-sensitive layer.

The co-sensitizers can be used independently or in combination of two or more thereof.

The amount of the co-sensitizer used is usually from 0.05 to 100 parts by weight, preferably from 1 to 80 parts by weight, still more preferably from 3 to 50 parts by weight, per 100 parts by weight of the ethylenically unsaturated double bond-containing polymerizable compound.

[Thermal Polymerization Inhibitor]

In the invention, it is preferred to add, in addition to the above-described fundamental ingredients, a thermal polymerization inhibitor in a small amount for inhibiting thermal polymerization of a polymerizable ethylenically unsaturated bond-containing compound during production or storage of the light-sensitive composition. Suitable thermal polymerization inhibitors include hydroquinone, p-methoxyphenol, di-tert-butyl-p-cresol, pyrogallol, tert-butylcatechol, benzoquinone, 4,4-thiobis(3-methyl-6-tert-butylphenol), 2,2'-methylenebis(4-methyl-6-tert-butylphenol), N-nitrosophenylhydroxylamine cerium (III) salt and N-nitrosophenylhydroxylamine aluminum salt.

The amount of the thermal polymerization initiator added is preferably from about 0.01% to about 5% by weight based on the whole solid components constituting the light-sensitive layer. Also, in order to prevent polymerization inhibition due to oxygen, a higher fatty acid derivative, for example, behenic acid or behenic amide may be added and unevenly distributed in the surface portion of the light-sensitive layer during the step of drying after coating, if desired. The amount of the higher fatty acid derivative added is preferably from about 0.5% to about 10% by weight based on the whole solid components constituting the light-sensitive layer.

[Other Additives]

Further, a colorant may be added for the purpose of coloring the light-sensitive layer. Examples of the colorant include pigments, for example, phthalocyanine pigments (e.g., C.I.Pigment Blue 15:3, 15:4 or 15:6), azo dyes, carbon black and titanium oxide; dyes, for example, Ethyl Violet, Crystal Violet, azo dyes, anthraquinone dyes and cyanine dyes. The amount of the dye or pigment added is preferably from about 0.5% to about 20% by weight based on the whole composition. Further, in order to improve physical properties of cured film, additives, for example, inorganic fillers and plasticizers (e.g., dioctylphthalate, dimethyl phthalate or tricresyl phosphate) may be added. The amount of such an additive is preferably 10% by weight or less based on the whole composition.

[Coating Solution]

In case of applying the light-sensitive layer, the above-described components are dissolved in a solvent to prepare a coating solution.

The solvent used includes an organic solvent, for example, acetone, methyl ethyl ketone, cyclohexsanone, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate or ethyl lactate. The solvents may be used independently or in combination.

The concentration of solid content in the coating solution is ordinarily from 1 to 50% by weight.

It is also possible to add a surfactant for improving coated surface properties.

The coated amount of the light-sensitive layer is from about 0.1 to about 10 g/m$^2$, preferably from 0.3 to 5 g/m$^2$, more preferably from 0.5 to 3 g/m$^2$ in terms of a dry weight.

[4] Protective Layer

In a light-sensitive lithographic printing plate precursor for scanning exposure, which is a desirable embodiment of the light-sensitive composition of the invention, it is preferred to further provide a protective layer on the layer comprising the light-sensitive composition, because such exposure is conducted in the atmosphere. The protective layer prevents incorporation of a low molecular compound, for example, oxygen or a basic substance existing in the atmosphere, which inhibits image-forming reaction caused upon exposure in the light-sensitive layer, into the light-sensitive layer, thereby permitting exposure in the atmosphere. Therefore, the protective layer is required to have a low permeability to low molecular compound, for example, oxygen and, desirably, not to substantially inhibit transmission of light for exposure, to show excellent adhesion to the light-sensitive layer and to be readily removed in a developing step after the exposure. Investigations on the protective layer have been made and are described in detail in U.S. Pat. No. 3,458,311 and JP-A-55-49729.

Various proposals have been made for improving adhesion between the two layers. For example, it is described in U.S. Pat. Nos. 292,501 and 44,563 that sufficient adhesion can be obtained by mixing 20 to 60% by weight of an acrylic emulsion or a water-insoluble vinylpyrrolidone-vinyl acetate copolymer into a hydrophilic polymer mainly comprising polyvinyl alcohol and coating the mixture on the light-sensitive layer. Any of the known techniques may be applied to the protective layer in the invention. Methods of coating the protective layer are described in detail, for example, in U.S. Pat. No. 3,458,311 and JP-A-55-49729.

It is further possible to impart other functions to the protective layer. For example, safe light adaptability can further be enhanced without causing reduction in sensitivity, by adding a colorant (e.g., a water-soluble dye) having an excellent transmitting property for light of 350 to 550 nm employed for the exposure and capable of absorbing light of 550 nm or more with high efficiency.

As materials used for the protective layer, water-soluble polymer compounds having a comparatively excellent crystallization are exemplified. Specifically, there are known water-soluble polymers, for example, polyvinyl alcohol, polyvinylpyrrolidone, acidic celluloses, gelatin, gum arabic and polyacrylic acid. Of these, when polyvinyl alcohol is used as a major component, the most preferable results are obtained in view of fundamental properties, for example, oxygen barrier property and removability by development. The polyvinyl alcohol used for the protective layer may partly be substituted with ester, ether or acetal so long as it has unsubstituted vinyl alcohol units necessary for acquiring an enough oxygen barrier property and an enough water-solubility. Likewise, a part of the polyvinyl alcohol may be other copolymer component. Specific examples of polyvinyl alcohol include polyvinyl alcohols having a hydrolysis ratio of from 71 to 100% and having a molecular weight of from 300 to 2,400.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA--224, PVA-217EE, VA-217E, PVA-220E, PVA-224E, PVA-405, PVA-420, PVA-613 and L-8 manufactured by Kuraray Co., Ltd.

The components of the protective layer (e.g., selection of PVA and use of additives) and the coating amounts thereof are selected in consideration of oxygen barrier property, removability upon development and, in addition, anti-fogging property, adhesion and scratch resistance. Ordinarily, a higher hydrolysis ratio of PVA used (a higher content of unsubstituted vinyl alcohol unit in the protective layer) and a larger thickness of the layer may be advantageous in view of sensitivity because oxygen barrier property is more enhanced. However, when the oxygen barrier property is enhanced too much, there arise problems that undesirable polymerization reaction occurs during production or storage and that undesirable fog and thickening of image lines occur upon imagewise exposure. Also, the adhesion to the image areas and the scratch resistance are of extreme importance in view of handling the printing plate precursor. Specifically, to provide a hydrophilic layer comprising the water-soluble polymer on an oleophilic light-sensitive layer is liable to cause peeling of the layer due to insufficient adhesion force, and the peeled portion suffers polymerization inhibition due to oxygen, thereby causing defects, for example, curing failure of the light-sensitive layer.

The coated amount of the protective layer is ordinarily from 0.1 to 10 g/m², preferably from 0.5 to 5 g/m² in terms of a dry weight.

Next, the method for making the light-sensitive lithographic printing plate precursor of the invention is described in detail. The above-described light-sensitive lithographic printing plate precursor is imagewise exposed, and then developed with an alkali aqueous solution. The developing solution used for the plate-making method of the invention is described below.

[Developing Solution]

The developing solution used for the method of making the light-sensitive lithographic printing plate precursor of the invention is not particularly limited but, for example, a solution containing an inorganic alkali salt and a nonionic surfactant and having a pH of from 11.0 to 12.5 is preferably used.

The inorganic alkali salt is appropriately used. Examples thereof include an inorganic alkali agent, for example, sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. These may be used independently or in combination of two or more thereof.

In the case of using silicate, developing property can easily be adjusted by selecting a mixing ratio of silicon oxide ($SiO_2$) to alkali oxide ($M_2O$ (wherein M represents an alkali metal or an ammonium group)), which are components of the silicate and the concentration thereof. Of the alkali aqueous solutions, an alkali aqueous solution having the mixing ratio of silicon oxide($SiO_2$) to alkali oxide ($M_2O$) ($SiO_2/M_2O$ in molar ratio) of from 0.5 to 3.0 is preferred, and that of from 1.0 to 2.0 is more preferred. The amount of the $SiO_2/M_2O$ added is preferably from 1 to 10% by weight, more preferably from 3 to 8% by weight, most preferably from 4 to 7% by weight, based on the weight of the alkali aqueous solution. When the concentration is in the above-described range, there arise no reduction in developing property and processing ability, no formation of precipitates and crystals, and no gelation at neutralization of waste liquor of the developing solution, thereby causing no troubles in treatment of the waste liquor.

Also, an organic alkali agent may be supplementarily used for the purpose of fine adjustment of alkali concentration and assisting dissolution of the light-sensitive layer. The organic alkali agent includes monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide. The alkali agents may be used independently or in combination of two or more thereof.

The surfactant is appropriately used. Examples thereof include nonionic surfactants, for example, a nonionic surfactant having polyoxyalkylene ether group, a polyoxyethylene alkyl ester (e.g., polyoxyethylene stearate), a sorbitan alkyl ester (e.g., sorbitan monolaurate, sorbitan monostearate, sorbitan distearate, sorbitan monooleate, sorbitan sesquioleate or sorbitan trioleate) and a monoglyceride alkyl ester (e.g., glycerol monostearate or glyceron monooleate); anionic surfactants, for example, an alkylbenzenesulfonate (e.g., sodium dodecylbenzenesulfonate), an alkylnaphthalenesulfonate (e.g., sodium butylnaphthalenesulfonate, sodium pentylnaphthalenesulfonate, sodium hexylnaphthalenesulfonate or sodium octylnaphthalenesulfonate), an alkylsulfate (e.g., sodium laurylsulfate), an alkylsulfonate (e.g., sodium dodecylsulfonate) and a sulfosuccinic acid ester salt (e.g., sodium dilaurylsulfosuccinate); and amphoteric surfactants, for example, an alkylbetaine (e.g., laurylbetaine or stearylbetaine) and an amino acid. Nonionic surfactants having a polyoxyalkylene ether group are particularly preferred.

As the surfactant having a polyoxyalkylene ether group, compounds having the structure represented by formula (I) shown below are preferably used.

$$R^{40}-O-(R^{41}-O)_pH \quad (I)$$

wherein $R^{40}$ represents an alkyl group containing 3 to 15 carbon atoms, an aromatic hydrocarbon group containing 6 to 15 carbon atoms or a heteroaromatic ring group containing 4 to 15 carbon atoms. Each of these groups may have a substituent; and examples of the substituent include an alkylene group containing 1 to 20 carbon atoms, a halogen atom, e.g., Br, Cl or I, an aromatic hydrocarbon group containing 6 to 15 carbon atoms, an aralkyl group containing 7 to 17 carbon atoms, an alkoxy group containing 1 to 20 carbon atoms, an alkoxycarbonyl group containing 2 to 20 carbon atoms and an acyl group containing 2 to 15 carbon atoms. $R^{41}$ represents an alkylene group containing 1 to 100 carbon atoms, which may have a substituent. Examples of the substituent include an alkyl group containing 1 to 20 carbon atoms and an aromatic hydrocarbon group containing 6 to 15 carbon atoms. p represents an integer of from 1 to 100.

In the definition of the formula (I), specific examples of "aromatic hydrocarbon group" include a phenyl group, a tolyl group, a naphthyl group, an anthryl group, a biphenyl group and a phenanthryl group, and specific examples of "heteroaromatic ring group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group and a benzimidazolyl group.

Also, the moiety of $(R^{41}-O)_p$ in the formula (I) may be two or three kinds of groups within the above-described scope. Specifically, there may be illustrated a random or block chain of a combination of ethyleneoxy group and propyleneoxy group, a combination of ethyleneoxy group and isopropyleneoxy group, a combination of ethyleneoxy group and butyleneoxy group, and a combination of ethyleneoxy group and isobutyleneoxy group. In the invention, the surfactants having polyoxyalkylene ether group are used independently or in combination. The surfactant is effectively added in an amount of from 1 to 30% by weight, preferably from 2 to 20% by weight, in the developing solution. When the amount of the surfactant is too small, there results in some cases reduction in developing property whereas, when the amount is too large, there results in some cases a strong damage by the development, resulting in deterioration of printing durability of printing plate.

Examples of the nonionic surfactant having polyoxyalkylene ether group, represented by formula (I) include a polyoxyethylene alkyl ether, e.g., polyoxyethylene lauryl ether, polyoxyethylene cetyl ether and polyoxyethylene stearyl ether; a polyoxyethylene aryl ether, e.g., polyoxyethylene phenyl ether and polyoxyethylene naphthyl ether; and a polyoxyethylene alkylaryl ether, e.g., polyoxyethylene methylphenyl ether, polyoxyethylene octylphenyl ether and polyoxyethylene nonylphenyl ether.

The surfactants can be used independently or in combination thereof. Also, the amount of the surfactant used in the developing solution is preferably in the range of from 0.1 to 20% by weight in terms of the solid content.

The pH of the developing solution used in the plate-making method according to the invention is ordinarily from 11.0 to 12.7, preferably from 11.5 to 12.5, in view of the image-formation and the damage of the exposed area in the development.

The electric conductivity of the developing solution used in the invention is preferably from 3 to 30 mS/cm. In case when it is less than the lower limit, dissolution of the light-sensitive composition on the aluminum plate support surface becomes difficult, resulting in formation of stain at printing in some cases. On the other hand, in case when it exceeds the range, due to the high concentration of salt dissolution rate of the light-sensitive layer becomes extremely small, resulting in remaining of the layer in the unexposed areas in some cases. The electric conductivity is particularly preferably in the range of from 5 to 20 mS/cm.

(Exposure and Development Processing)

An image can be formed on the surface of the aluminum plate support by imagewise exposing the light-sensitive lithographic printing plate precursor of the invention using a conventionally known active light source, for example, a carbon arc lamp, a high-pressure mercury lamp, a xenon lamp, a metal halide lamp, a fluorescent lamp, a tungsten lamp, a halogen lamp, a helium cadmium laser, an argon ion laser, an FD-YAG laser, a helium neon laser or a semiconductor laser (350 nm to 600 nm), followed by development processing. It is possible to provide, between the imagewise exposure and the development processing, a process of heating at a temperature of 50 to 140° C. for 1 second to 5 minutes for the purpose of increasing the curing ratio of the light-sensitive layer. Heating at a temperature in the above-described range serves to increase the curing ratio and prevents the remaining film due to dark polymerization in the unexposed area.

As described hereinbefore, when a protective layer is provided on the light-sensitive layer of the light-sensitive lithographic printing plate precursor of the invention, there have been known a method of removing both the protective layer and the unexposed area of the light-sensitive layer at the same time by using a developing solution and a method of first removing the protective layer with water or warm water, and then removing the unexposed area of the light-sensitive layer by development. Into the water or warm water may be incorporated an antiseptic described in JP-A-10-10754 or an organic solvent described in JP-A-8-278636.

The development of the light-sensitive lithographic printing plate precursor of the invention with the above-described developing solution is conducted in a conventional manner at a temperature of from 0 to 60° C., preferably from about 15 to about 40° C., for example, by immersing the exposed light-sensitive lithographic printing plate precursor in the developing solution and rubbing with a brush.

Further, in the case of conducting development processing using an automatic developing machine, the developing solution becomes fatigued in accordance with the processing amount, and hence the processing ability may be restored by using a replenishing solution or a fresh developing solution.

The thus development-processed light-sensitive lithographic printing plate precursor is after-treated with washing water, a rinsing solution containing a surfactant, and a desensitizing solution containing gum arabic or a starch derivative as described in JP-A-54-800-2, JP-A-55-115045 and JP-A-5-9-5843-4. In the after-treatment of the light-sensitive lithographic printing plate precursor of the invention, these processings may be used in combination.

The printing plate thus-obtained by the above-described processing may be subjected to the after-exposing treatment described in JP-A-2000-89478 or a heating treatment, for example, baking to improve printing durability.

The lithographic printing plate obtained is mounted on an offset printing machine to make many prints.

The present invention is described in more detail with reference to the following examples, but the invention should not be construed as being limited thereto.

EXAMPLES 1 TO 3 AND COMPARATIVE EXAMPLES 1 TO 3

The surface of a 0.3 mm-thick aluminum plate was grained using a nylon brush and an aqueous suspension of 400-mesh pumice stone, followed by well washing with water. After immersing in 10% sodium hydroxide at 70° C. for 60 seconds to conduct etching, the plate was washed with running water, neutralized and cleaned with 20% $HNO_3$, and then washed with water. The resulting plate was subjected to an electrolytic graining treatment in 1% nitric acid using a sine-wave alternating current at an anodic time electricity of 130 coulomb/$dm^2$ under the condition of Va=12.7 V. The surface roughness measured was 0.35 μm (in terms of Ra). Subsequently, the aluminum plate was immersed in a 30% sulfuric acid aqueous solution, desmutted at 55° C. for 2 minutes, and then the grained surface was anodized in a 20% sulfuric acid aqueous solution at a current density of 2 A/$dm^2$ to have an anodized film thickness of 2.7 g/$m^2$ by disposing a cathode on the grained surface side. At the same time, another cathode was disposed on the back side of the aluminum plate to form an anodized film of 2.7 g/$m^2$ (Example 1), 1.3 g/$m^2$ (Example 2) or 0.7 g/$m^2$ (Example 3) by employing a current density of 2 A/$dm^2$, 1 A/$dm^2$ or 0.5 A/$dm^2$, thereby preparing each support. In the same manner, a support having an anodized film of 0.3 g/$m^2$ (Comparative Example 1) was prepared except for changing the electric current density on the back side of the aluminum plate to 0.3 A/$dm^2$.

The amount of each anodized film means amounts at three points; one amount being the amount of anodized film in the central portion of the anodized film formed on the back surface of the aluminum plate, and the other two amounts being the amounts of anodized film at the positions that are located approximately 5 cm away from the respective closet edges of the aluminum plate and forms a line in the transverse direction passing through the central portion and crossing the aluminum plate at right angles with respect to the treatment direction.

Also, a support was prepared using the cathode and the electric current on the grained side in the same manner as above, but omitting the cathode on the back side. With the support, the amount of the anodized film on the back surface was about 0.2 g/$m^2$ in the central portion and about 0.5 g/$m^2$ in the edge portions (Comparative Example 2). Separately, a support was prepared under such condition that a plate for preventing the electric line of force from going around the back surface was provided on the back side so as to make difficult the formation of an anodized film. The amount of the anodized film formed on the back side of the support was 0 in the central portion of the aluminum plate, and 0.3 g/$m^2$ in the edge portions (Comparative Example 3).

The following light-sensitive solution was coated on each of the supports in an amount of 1.4 g/m², and dried at 100° C. for 5 minutes.

| (Light-sensitive solution) | |
|---|---|
| Pentaerythritol tetraacrylate | 1.5 g |
| Benzyl methacrylate/methacrylic acid (80/20) copolymer (A) (molecular weight: 30,000) | 2.0 g |
| Compound represented formula (1) below | 0.15 g |
| Compound represented formula (1) below | 0.20 g |
| Compound represented formula (1) below | 0.4 g |
| Dispersion of β-type copper phthalocyanine in copolymer (A) (25/75 by weight) | 0.2 g |
| Megafac F-177 (fluorine-containing ssurfactantr; made by Dainippon Ink & Chemicals, Inc.) | 0.2 g |
| Propylene glycol monomeethyl ether | 17.5 g |
| Methyl ethyl ketone | 19.0 g |

(1)

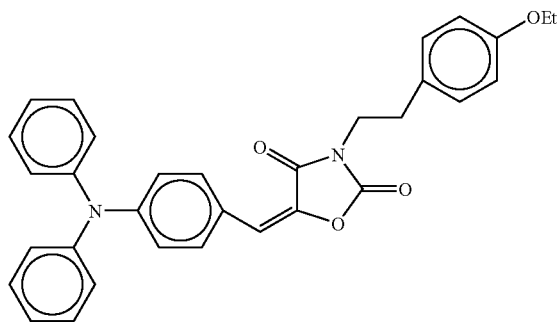

(2)

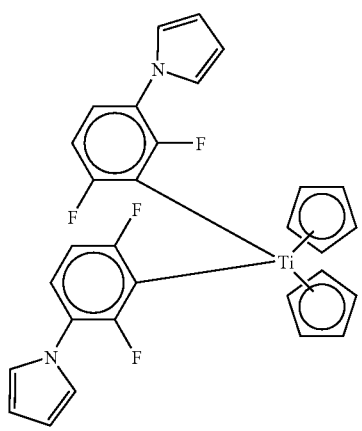

(3)

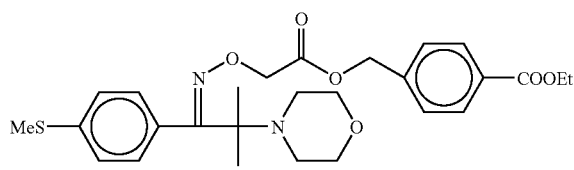

A 3% aqueous solution of a 9:1 mixture of polyvinyl alcohol (saponification degree: 90 mol %; polymerization degree: 1,000) and polyvinylpyrrolidone (molecular weight: 30,000) was prepared and coated on the light-sensitive layer in a dry coating weight of 2.5 g/m², followed by drying at 100° C. for 10 minutes.

Six kinds of the thus-obtained light-sensitive lithographic printing plate precursors (Examples 1 to 3 and Comparative Examples 1 to 3) were cut into 1030 mm×800 mm plates respectively to prepare 10 test plates for each printing plate precursor. Each of the test plates was subjected to the steps of conveying, mounting, imagewise exposing, demounting and conveying in a Vx-9000 violet laser exposing machine made by Fuji Photo Film Co., Ltd. and, then subjected to development using a developing solution (DV-2, made by Fuji Photo Film Co., Ltd.) at 28° C. for 20 seconds in an automatic developing machine (FLP-1260, made by Fuji Photo Film Co., Ltd.) provided immediately after the exposing machine.

All of the images thus obtained were clear and showed no troubles with respect to sensitivity and resolution. Scratch on the back surface of the aluminum plate was visually evaluated. A plate with no scratch was ranked O, a plate with slight scratch in the conveying direction was ranked Δ, and a plate with deep scratch was ranked X. The results are shown in Table 1.

TABLE 1

| | Formation of Scratch |
|---|---|
| Example 1 | ○: 9 plates and Δ: 1 plate |
| Example 2 | ○: 8 plates and Δ: 2 plates |
| Example 3 | ○: 8 plates and Δ: 2 plates |
| Example 4 | ○: 9 plates and Δ: 1 plate |
| Example 5 | ○: 9 plates and Δ: 1 plate |
| Comparative Example 1 | Δ: 3 plates and X: 7 plates |
| Comparative Example 2 | Δ: 4 plates and X: 6 plates |
| Comparative Example 3 | Δ: 1 plates and X: 9 plates |
| Comparative Example 4 | Δ: 5 plates and X: 5 plates |
| Comparative Example 5 | Δ: 4 plates and X: 6 plates |

EXAMPLE 4 AND COMPARATIVE EXAMPLE 4

The same procedures as in Example 1 were conducted except for coating the back coat layer solution shown below on the back side (opposite side to the light-sensitive layer) of each of the supports obtained in Example 2 and Comparative Example 1, followed by drying to provide a back coat layer in a dry weight of 0.2 g/m². All images thus obtained were clear and caused no problems. The results of observing scratch on the back surface of the aluminum plate are shown in Table 1.

| (Back coat layer solution) | |
|---|---|
| Saturated copolymerized polyester resin (trade name: Chemit K-1294, mage by Toray Industries, Inc.) | 3.5 g |
| Megafac F176 | 0.05 g |
| Methyl ethyl ketone | 100 g |

EXAMPLE 5 AND COMPARATIVE EXAMPLE 5

The same procedures as in Example 1 were conducted except for coating the back coat layer solution shown below on the back side. (opposite side to the light-sensitive layer) of each of the supports obtained in Example 2 and Comparative Example 1, followed by drying to provide a back coat layer in a dry weight of 50 g/m². All images thus obtained were clear and caused no problems. The results of observing scratch on the back surface of the aluminum plate are shown in Table 1.

| (Back coat layer solution) | |
|---|---|
| Tetraethyl silicate | 50 parts by weight |
| Water | 20 parts by weight |
| Methanol | 10 parts by weight |
| Phosphoric acid | 0.07 parts by weight |

When the above-described components were mixed and stirred, heat generation initiated within about 5 minutes. After reacting for 30 minutes, the solution shown below was added thereto to prepare the back coat layer solution.

| Pyrogallol-formaldehyde condensation resin (Mw: 2,000) | 4 parts by weight |
|---|---|
| Dimethyl phthalate | 5 parts by weight |
| Methanol | 1,000 parts by weight |

As is shown in Table 1, formation of scratch is markedly reduced according to the invention.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A method of producing a light-sensitive lithographic printing plate precursor, wherein the lithographic printing plate comprises: an aluminum support; a photo-polymerizable light-sensitive layer on one side of the support; and an anodized film on an entire surface of the support opposite to the light-sensitive layer side, the anodized film being provided uniformly in an amount of 0.5 $g/m^2$ or more, the method comprising the steps of:

providing cathodes on both sides of the aluminum support; and subjecting the aluminum support to anodizing treatment, so as to form the anodized film.

2. The method of claim 1, wherein (a) an amount of the anodized film in a central portion of the anodized film and (b) amounts of the anodized film at portions that are located approximately 5 cm away from respective closest edges of the aluminum support and forms a line in a transverse direction passing through the central portion and crossing the aluminum support at right angles with respect to a treatment direction are 0.5 $g/m^2$ or more.

3. A method of producing a light-sensitive lithographic printing plate precursor for a CTP (Computer-To-Plate) system comprising the method of claim 1.

4. A method of producing a light-sensitive lithographic printing plate precursor for a CTP (Computer-To-Plate) system comprising the method of claim 2.

* * * * *